United States Patent
Koike et al.

(10) Patent No.: US 7,045,829 B2
(45) Date of Patent: May 16, 2006

(54) LIGHT-EMITTING SEMICONDUCTOR DEVICE USING GROUP III NITRIDE COMPOUND

(75) Inventors: Masayoshi Koike, Aichi-ken (JP); Shinya Asami, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 99 days.

(21) Appl. No.: 08/681,412

(22) Filed: Jul. 23, 1996

(65) Prior Publication Data
US 2003/0057433 A1 Mar. 27, 2003

(30) Foreign Application Priority Data
Jul. 24, 1995 (JP) ............................................. 7-209181

(51) Int. Cl.
*H01L 33/00* (2006.01)

(52) U.S. Cl. ...................................................... 257/103
(58) Field of Classification Search ................... 257/94, 257/103, 79, 101
See application file for complete search history.

(56) References Cited

U.S. PATENT DOCUMENTS

| | | | | |
|---|---|---|---|---|
| 5,006,908 A | * | 4/1991 | Matsuoka et al. ............. | 357/17 |
| 5,076,860 A | | 12/1991 | Ohba et al. | |
| 5,173,751 A | * | 12/1992 | Ota et al. ...................... | 257/76 |
| 5,247,533 A | * | 9/1993 | Okazaki et al. ............... | 372/45 |
| 5,281,830 A | * | 1/1994 | Kotaki et al. .................. | 257/86 |
| 5,389,571 A | * | 2/1995 | Takeuchi et al. ............. | 437/133 |
| 5,428,634 A | | 6/1995 | Bryan et al. | |
| 5,523,589 A | * | 6/1996 | Edmond et al. ............... | 257/77 |
| 5,578,839 A | * | 11/1996 | Nakamura et al. ............ | 257/96 |
| 5,650,641 A | * | 7/1997 | Sassa et al. .................... | 257/88 |
| 5,652,438 A | | 7/1997 | Sassa et al. | |
| 5,670,798 A | | 9/1997 | Schetzina | |
| 5,700,713 A | * | 12/1997 | Yamazaki et al. ........... | 437/129 |
| 5,862,167 A | | 1/1999 | Sassa et al. .................... | 257/98 |

FOREIGN PATENT DOCUMENTS

| | | |
|---|---|---|
| JP | 59-228776 | 12/1984 |
| JP | 1-17484 | 1/1989 |
| JP | 2-229475 | 9/1990 |

OTHER PUBLICATIONS

Sze, Physics of Semiconductor Devices, 1981,John Wiley, $2^{nd}$ Edition, pp709–710.*
Japanese Office Action dated Feb. 3, 2004, with Partial English translation.

* cited by examiner

*Primary Examiner*—W. David Coleman
(74) *Attorney, Agent, or Firm*—McGinn & Gibb, PLLC

(57) ABSTRACT

A Group III nitride compound semiconductor includes a multiple layer structure having an emission layer between an n-type cladding layer and a p-type cladding layer. The n-type cladding layer may be below the emission layer, having been formed on another n-type layer which was formed over a buffer Layer and a sapphire substrate. The emission layer has a thickness which is wider than the diffusion length of holes within the emission layer. The n-type cladding layer is doped with a donor impurity and has a lattice constant Substantially equal to a lattice constant of the emission layer. The p-type cladding layer is doped with an acceptor impurity and has a forbidden band sufficiently wider than the forbidden band of the emission layer in ordor to confine electrons injected into the emission layer.

25 Claims, 3 Drawing Sheets

LIGHT-EMITTING SEMICONDUCTOR DEVICE USING GROUP III NITRIDE COMPOUND

BACKGROUND OF THE INVENTION

1. Field of the Invention

The present invention relates to a light-emitting semiconductor diode (LED) that uses a Group III nitride compound. More particularly, it relates to an LED having an improved emission efficiency in tho ultra violet region.

2. Description of the Background Information

A known light-emitting semiconductor diode (LED) using a Group III nitride compound comprises an n⁺-layer comprising GaN, an n-layer comprising $Al_{0.08}Ga_{0.92}N$, an emission layer comprising $In_{0.08}Ga_{0.92}N$, and a p-layer comprising $Al_{0.08}Ga_{0.92}N$. The known LED's emission mechanism uses inter-band recombination of electrons to obtain ultra violet color light with a peak wavelength of 380 nm or shorter.

However, the LED has a low luminous efficiency for several reasons, including a dislocation caused by a mismatch of lattice constants among the n'-layer, the n-layer, and the emission layer which invites poor crystallinity of the emission layer made of InGaN.

SUMMARY OF THE INVENTION

An object of the present invention is, therefore, to improve the luminous efficiency of an LED in the ultraviolet region utilizing a Group III nitride compound.

A first aspect of the present invention is directed to a Group III nitride compound semiconductor comprising a triple layer structure having an emission layer sandwiched between an n-type cladding layer and a p-type cladding layer.

The emission layer satisfies the formula

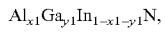

where $0 \leq x1 \leq 1$, $0 \leq y1 \leq 1$, and $0 \leq x1+y1 \leq 1$, and has a thickness wider than the diffusion length of holes. The n-type cladding layer satisfies the formula

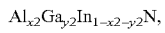

where $0 \leq x2 \leq 1$, $0 \leq y2 \leq 1$, and $0 \leq x2+y2 \leq 1$, and is doped with a donor impurity. The lattice constant of the n-type cladding layer is substantially equal to the lattice constant of the emission layer. The p-type cladding layer satisfies the formula

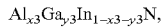

where $0 \leq x3 \leq 1$, $0 \leq y3 \leq 1$, and $0 \leq x3+y3 \leq 1$, and is doped with an acceptor impurity. The width of the forbidden band of the p-type cladding layer is wider than the width of forbidden band of the emission layer by an amount sufficient to confine electrons injected into the emission layer.

According to a second aspect of the invention, the emission layer comprises $Ga_{y2}In_{1-y2}N$, where $0.92 \leq y2 \leq 1$ and the n-type cladding layer comprises gallium nitride (GaN) doped with a donor impurity.

According to a third aspect of the invention, the n-type cladding layer is formed on another n-type layer, which comprises gallium nitride (GaN) and is doped with a donor impurity at a density relatively higher then the n-type cladding layer.

According to a fourth aspect of the invention, the donor impurity is silicon (Si).

According to a fifth aspect of the invention, the acceptor impurity is magnesium (Mg).

According to a sixth aspect of the invention, the emission layer is doped with silicon (Si).

The composition ratio parameters x2 and y2 of the n-type cladding layer satisfying the formula

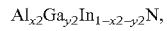

where $0 \leq x2 \leq 1$, $0 \leq y2 \leq 1$, and $0 \leq x2+y2 \leq 1$, is designed that the lattice constant of the n-type cladding layer may be substantially equal to the lattice constant of the emission layer. As a result, crystallinity of the emission layer is improved.

Further, the composition ratio x3 and y3 of the p-type cladding layer satisfying the formula

where $0 \leq x3 \leq 1$, $0 \leq y3 \leq 1$, and $0 \leq x3+y3 \leq 1$, is designed to form a forbidden band sufficiently wider than that of the emission layer to confine electrons injected from the n-type cladding layer to the emission layer.

Conventionally, a barrier between the n-type cladding layer and the emission layer has been made large to confine holes injected from the p-type cladding layer into the emission layer. The inventors of the present invention conducted a series of studies and found that when the diffusion length of holes, or life span, is short, i.e., about a 0.1 μm, compared with thickness of the emission layer, forming a large barrier between the n-type cladding layer and the emission layer is less useful as for its original purpose to confine holes. Therefore, that barrier may be designed to be small. Accordingly, the composition ratio x2 and y2 of the n-type cladding layer satisfying the formula

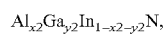

where $0 \leq x2 \leq 1$, $0 \leq y2 \leq 1$, and $0 \leq x2+y2 \leq 1$, can be selected so as to minimize lattice mismatching between the n-type cladding layer and the emission layer. As a result, crystallinity of the emission layer is improved arid emission efficiency of the LED in the ultraviolet region is improved.

When the emission layer is comprised of $Ga_{y2}In_{1-y2}N$ ($0.92 \leq y2 \leq 1$), the lattice mismatch between the emission layer and the n-type cladding layer is mitigated by forming the n-type cladding layer with GaN for light emission in the ultraviolet region.

The LED has an AlN buffer layer on a sapphire substrate. A highly Si-doped GaN n⁺-layer of high carrier concentration is forced on the AlN buffer layer. An n-type cladding layer is formed on the n⁺-layer which leads current to the n-type cladding layer. Because the n-type cladding layer is comprised of GaN, the lattice constant of the n⁺-layer and that of the n-type cladding layer precisely latch each other. Accordingly, lattice mismatching is not transferred to an emission layer formed on the n-type cladding layer, and crystallinity of the emission layer is improved.

The above and other objects, features, advantages, and characteristics of the present invention are further described in the following detailed description with reference to the accompanying drawings by way of non-limiting exemplary embodiments of the present invention, wherein like reference numerals represent similar parts of the embodiments throughout the several views.

DETAILED DESCRIPTION OF SEVERAL EXEMPLARY EMBODIMENTS

The invention will be more fully understood by reference to the following example.

EXAMPLE

Figure 1:
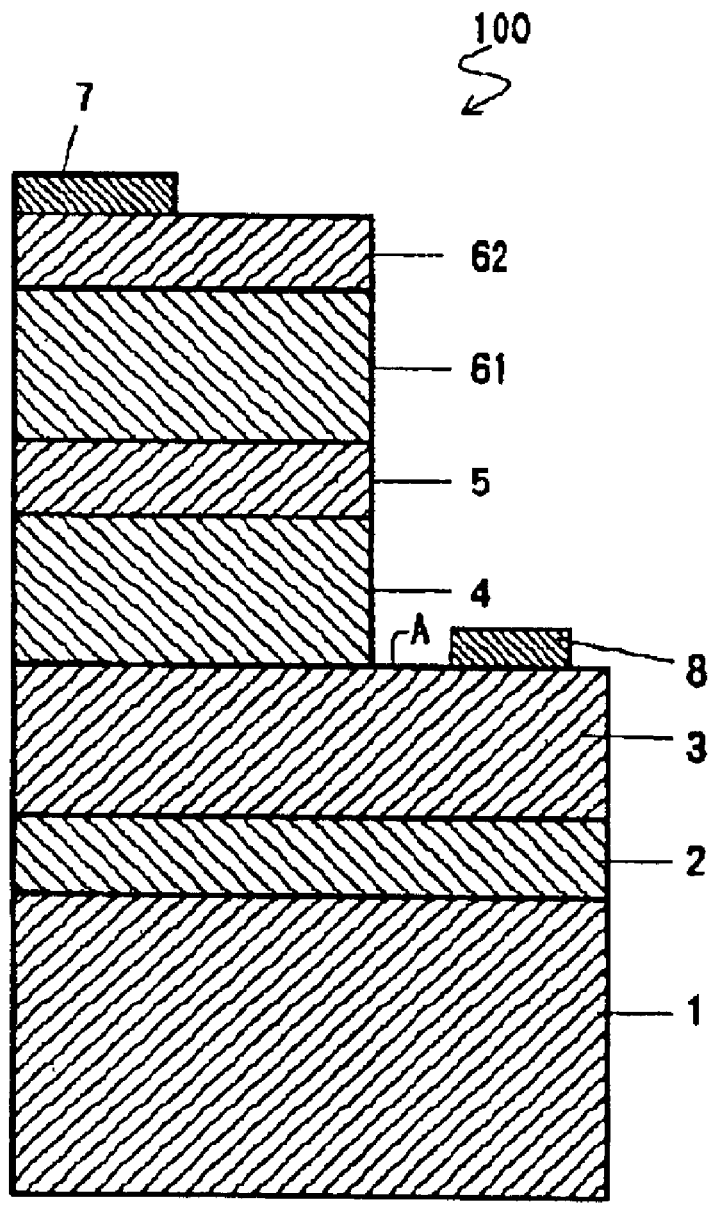
FIG. 1 is a diagram showing the structure of an LED in the example set forth below.

FIG. 1 shows an Example LED 100. The illustrated LED 100 has a sapphire ($Al_2O_3$) substrate 1 upon which an aluminum nitride (AlN) buffer layer 2 having a thickness generally of 500 Å is forced. Consecutively, two n-type layers are formed on the AlN buffer layer 2: a silicon (Si) doped GaN n⁻-layer 3 of high carrier concentration, having a thickness generally of 5.0 μm and having a Si concentration of $5 \times 10^{18}/cm^3$ and having an electron concentration of $2.5 \times 10^{18}/cm^3$ and a Si-doped GaN cladding layer 4 having a thickness generally of 0.5 μm and having a Si concentration of $1 \times 10^{18}/cm^3$ and having an electron concentration of $5 \times 10^{17}/cm^3$. An emission layer 5, comprised of $In_{0.07}Ga_{0.93}N$ and having a thickness of generally 0.5 μm. is formed on the cladding layer 4. Two p-layers are formed on the emission layer 5: an Mg-doped p-type cladding layer 61, comprised of $Al_{0.08}Ga_{0.92}N$, having a thickness generally of 0.5 μm and having a hole concentration of $5 \times 10^{17}/cm^3$, and an Ng concentration of $5 \times 10^{20}/cm^3$; and an Mg doped GaN p-type layer 62 functioning as a contact layer, having a hole concentration of $7 \times 10^{18}/cm^3$, and having an Mg concentration of $5 \times 10^{21}/cm^3$. Nickel electrodes 7 and 8 are each connected to the contact layer 62 and the n⁺-layer 3, respectively.

Band gap of the GaN cladding layer 4 is 3.4 eV and its lattice constant is 3.160 Å. Band gap of the emission layer 5 of $In_{0.07}Ga_{0.93}N$ is 3.22 eV and its lattice constant is 3.187 Å. Band gap of the cladding layer 61 of $Al_{0.08}Ga_{0.92}N$ is 3.54 eV and its lattice constant is 3.156 Å. The composition ratios of the cladding layer 4 and the emission layer 5 are designed to make misfit between them it 0.85%.

The illustrated LED 100 is produced by gaseous phase epitaxial growth, called metal organic vapor phase epitaxy, referred to as MOVPE hereinafter.

The gases employed in this process are ammonia ($NH_3$), a carrier gas ($N_2$ or $N_2$), trimethyl gallium ($Ga(CH_3)_3$) (hereinafter TMG), trimethyl aluminum ($Al(CH_3)_3$) (hereinafter TMA), trimethyl indium ($In(CH_3)_3$) (hereinafter TMI), silane ($SiH_4$), and biscyclopentadienyl magnesium ($Mg(C_5H_5)_2$) (hereinafter $CP_2Mg$).

The single crystalline sapphire substrate 1 has a thickness of about 100 μm to 400 μm. After having its main surface 'a' cleaned by an organic washing solvent and heat treatment, the sapphire substrate 1 was placed on a susceptor in a reaction chamber for the MOVPE treatment. Then the sapphire substrate 1 was baked at 1100° C. by $H_2$ vapor fed into the chamber at a flow rate 2 liter/min. under normal pressure for a period of 30 min.

A 500 Å thick AlN buffer layer 2 was formed on the surface 'a' of the baked sapphire substrate 1 under conditions controlled by lowering the temperature in the chamber to 400° C., keeping the temperature constant, and concurrently supplying for a period of 90 sec. $H_2$ at a flow rate of 20 liter/min., $NH_3$ at 10 liter/min., and TMA at $1.8 \times 10^{-5}$ mol/min.

About 5.0 μm in thickness of Si-doped GaN was formed on the buffer layer 2, as an n⁻-layer 3 of high carrier concentration with a Si concentration of about $5 \times 10^{18}/cm^3$ and an electron concentration of about $2.5 \times 10^{18}/cm^3$, under conditions controlled by keeping the temperature of the sapphire substrate 1 at 1150° C. and concurrently supplying for 30 min. $H_2$ at a flow rate of 20 liter/min., $NH_3$ at 10 liter/min., TMG at $1.7 \times 10^{-4}$ mol/min., and silane diluted to 0.86 ppm by $H_2$ at 200 ml/min.

About 0.5 μm in thickness of Si-doped GaN was formed on the n⁺-layer 3, as an n-type cladding layer 4 with a Si concentration of about $1 \times 10^{18}/cm^3$ and an electron concentration of about $5 \times 10^{17}/cm^3$, under conditions controlled by keeping the temperature of the sapphire substrate 1 at 1100° C. and concurrently supplying for 30 min. $H_2$ or $N_2$ at a flow rate of 10 liter/min., $NH_3$ at 10 liter/min., TMG at $1.12 \times 10^{-4}$ mol/min., and silane diluted to 0.86 ppm by $H_2$ at $10 \times 10^{-9}$ mol/min.

About 0.5 μm in thickness of $In_{0.07}Ga_{0.93}N$ was formed on the n-type cladding layer 4 as emission layer 5 under conditions controlled by keeping the temperature of the sapphire substrate 1 at 850° C. and concurrently supplying for 60 min. $H_2$ at a flow rate of 20 liter/min, $NH_3$ at 10 liter/min., TMG at $1.53 \times 10^{-4}$ mol/min., and TMI at $0.02 \times 10^{-4}$ mol/min.

About 1.0 μm in thickness of Mg-doped $Al_{0.08}Ga_{0.92}N$ p-type cladding layer 61 was formed on the omission layer 5 under conditions controlled by keeping the temperature of the sapphire substrate 1 at 1100° C. and concurrently supplying for 60 min. $N_2$ or $H_2$ at a flow rate of 20 liter/min., $NH_3$ at 10 liter/min., TMG at $1.12 \times 10^{-4}$ mol/min., TMA at $0.47 \times 10^{-4}$ mol/min., and $CP_2Mg$ at $2 \times 10^{-4}$ mol/min. The resistivity of the cladding layer 61 was $10^8$ Ω·cm or more, exhibiting insulating characteristics. The impurity concentration of Mg doped into the cladding layer 61 was $1 \times 10^{20}/cm^3$.

About 0.2 μm in thickness of Mg-doped GaN, serving as a contact layer 62, was formed on the cladding layer 61 under conditions of keeping the temperature of the sapphire substrate 1 at 1100° C. and concurrently supplying for 4 min. $N_2$ or $N_2$ at a flow rate of 20 liter/min., $NH_3$ at 10 liter/min., TMG at $1.12 \times 10^{-4}$ mol/min. and $CP_2Mg$ at $4 \times 10^{-4}$ mol/min. The resistivity of the contact layer 62 was $10^8$ Ω·cm or more, exhibiting insulating characteristics. The impurity concentration of Mg doped into the contact layer 62 was $2 \times 10^{20}/cm^3$.

Figure 2:
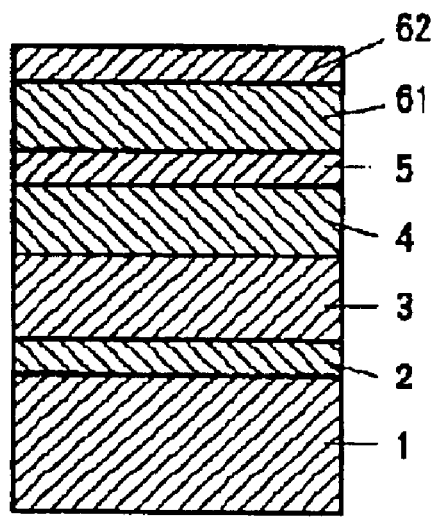
FIGS. 2 through 5 are sectional views illustrating a process for manufacturing the LED in the example.

Then, heat treatment was uniformly carried out on the wafer at 450° C. for a period of 45 min. The heat treatment changed the insulative contact layer 62 and the insulative cladding layer 61 to each be a p-type conductive semiconductors with respective hole concentrations of $7 \times 10^{17}/cm^3$ and $5 \times 10^{17}/cm^3$ and respective resistivities of 2 Ω·cm and 0.8 Ω·cm. As a result, a wafer with a multiple layer structure was obtained as shown in FIG. 2.

Figure 3:
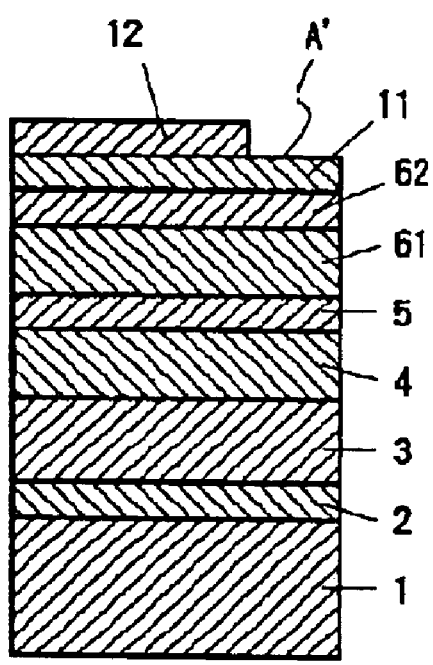
Figure 4:
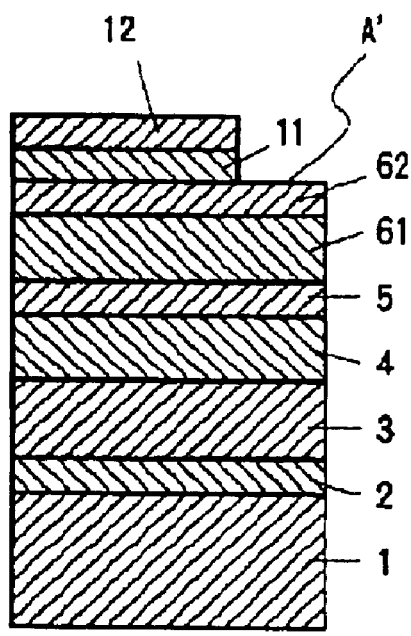

As shown in FIG. 3 about 2000 Å in thickness of $SiO_2$ was deposited by sputtering to form a layer 11 on the contact layer 62. Then, the $SiO_2$ layer 11 was coated with a photoresist layer 12. A selected part or area of the photoresist layer 12, named A', which corresponds to an electrode forming part, was removed by photolithography as shown in FIG. 3. Part of the $SiO_2$ layer 11 which was not covered with the photoresist layer 12 was then etched off by an etching liquid such as hydrofluoric acid as shown in FIG. 4.

Figure 5:
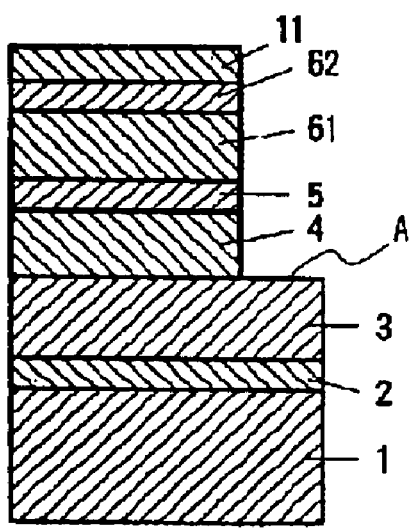

Then, the exposed part of the successive layers, from the surface of the device, or the p-type contact layer 62, to the n-type cladding layer 4, were removed by dry etching, or by supplying a high-frequency power density of 0.44 W/cm$^2$ and BCl$_3$ gas of 10 ml/min. at a vacuum degree of 0.04 Torr. After that, dry etching was carried out with argon (Ar) on the exposed surface of the n$^+$ layer 3. Consequently, a hole A was formed for forming an electrode extending in the n$^+$-layer 3 as shown in FIG. 5.

Then, through processes including laminating a Ni layer, laminating a photoresist layer, carrying out photolithography, and wet etching, electrodes 7 and 8 were formed respectively connected to the p-type contact layer 62 and bottom of the hole A or the exposed part of the n$^+$-layer 3. The wafer treated with the above-mentioned process was divided or diced to form separate chips or elements including an LED 100 as shown in FIG. 1.

The obtained LED 100 was found to have a luminous intensity of 1 mW and a peak wavelength of 380 nm in the luminous spectrum at a driving current of 20 mA. The luminous efficiency was 1.5% which is 5 folds that of a conventional LED.

Because both the n$^+$-layer 3 and the n-type cladding layer 4 were formed of GaN, no lattice mismatching occurred between the layers. Accordingly, any mismatching (misfit) of lattice constant was transferred to the emission layer 5 comprising In$_{0.07}$Ga$_{0.93}$N. Further, the degree of mismatching between the lattice constants of GaN and In$_{0.07}$Ga$_{0.93}$N was small. As a result, the crystallinity of the emission layer 5 was improved. The thickness of the emission layer 5, which is about 0.5 μm in the illustrated Example, was longer than the diffusion Length, or life span, of holes injected from the p-type cladding layer, so that the luminous efficiency could be maintained despite the small barrier between the n-type cladding layer 4 and the emission layer 5. As a result of the above identified features, the luminous efficiency in the ultraviolet region was improved compared with a conventional LED.

While the invention has been described in connection with what are presently considered to be the most practical and preferred embodiments, it is to be understood that the invention is not to be limited to the disclosed embodiments, but on the contrary, is intended to cover various modifications and equivalent arrangements such as those included within the spirit and scope of the appended claims. Some examples of such modification may include the following.

The misfit ratio between the cladding layer 4 and the emission layer 5 in the illustrated example is 0.85%. Preferable misfit ratio between them is within 1%.

In the illustrated Example, GaN and In$_{0.07}$Ga$_{0.93}$N are used as an example of four element compounds of Al$_x$Ga$_y$In$_{1-x-y}$N. In general, a lattice constant and a band gap of the Al$_x$Ga$_y$In$_{1-x-y}$N is determined according to mixed crystal ratio of GaN, InN, and AlN whose lattice constants are respectively 3.160 Å, 3.544 Å, and 3.110 Å and whose band gaps are respectively 8.4 eV, 1.95 eV, and 6.0 eV.

In the illustrated Example, the LED 100 has a double-hetero junction structure. Another junction structure may be used, such as a single-hetero junction structure. In addition, for example, although heat treatment was used to obtain p-type conduction, electron irradiation can be used as an alternate.

The emission layer 5 in the illustrated Example is not doped with any impurities. The emission layer 5 may be doped with a donor impurity such as silicon (Si) and an acceptor impurity such as (Zn).

Further, the emission layer 5 in the illustrated Example has a thickness of 0.5 μm. Preferable thickness of the emission layer 5 ranges from 0.1 μm to 1.0 μm. It is not preferable that the emission layer is thinner than 0.1 μm, because barrier between the emission layer 5 and the n-type cladding layer 4 is small and unable to confine holes effectively. It is not preferable that the emission layer is thicker than 1.0 μm, because confining electrons whose diffusion length are 1 μm becomes less effective.

Although the illustrated Example provides an LED, a laser diode can be provided as art alternate.

What is claimed is:

1. A Group III nitride compound semiconductor comprising:

a substrate, an n-type cladding layer formed on or above said substrate, an emission layer formed on or above said n-type cladding layer, and a p-type cladding layer formed on or above said emission layer, said emission layer satisfying the formula $$Al_{x1}Ga_{y1}In_{1-x1-y1}N,$$

where $0 \leq x1 \leq 1$, $0 \leq y1 \leq 1$, and $0 \leq x1+y1 \leq 1$, and having a thickness 0.1 μm to 1.0 μm which is larger than diffusion length of holes into which electrons are injected from said n-type cladding layer and holes are injected from said p-type cladding layer;

said n-type cladding layer satisfying the formula $$Al_{x2}Ga_{y2}In_{1-x2-y2}N,$$

where $0 \leq x2 \leq 1$, $0 \leq y2 \leq 1$, and $0 \leq x2+y2 \leq 1$, being doped with a donor impurity, having a forbidden band wider than a forbidden band of said emission layer and having a lattice constant substantially equal to a lattice constant of said emission layer but being not matched with the lattice of said substrate; and said p-type cladding layer satisfying the formula $$Al_{x3}Ga_{y3}In_{1-x3-y3}N,$$

where $0 \leq x3 \leq 1$, $0 \leq y3 \leq 1$, and $0 \leq x3+y3 \leq 1$, being doped with an acceptor impurity, having a forbidden band wider than said forbidden band of said emission layer;

wherein the relative amounts of the constituent materials in each of said n-type cladding layer, said p-type cladding layer, and said emission layer are selected such that upon applying an external driving voltage to the semiconductor, said external driving voltage sufficient to bias said semiconductor above a threshold voltage:

1) a barrier between a conduction band of said p-type layer and a conduction band of said emission layer will have a height sufficient to confine electrons in said emission layer while a valence band of said p-type layer and a valence band of said emission layer will be substantially at the same energy level;

2) a barrier between a valence band of said n-type layer and a valence band of said emission layer will be of a height that is insufficient to confine holes in said emission layer while a conduction band of said n-layer and a conduction band of said emission layer are substantially at the same energy level; and 3) a forbidden band of said p-type cladding layer will be wider than a forbidden band of said n-type cladding layer.

2. The Group III nitride compound semiconductor according to claim 1, wherein said emission layer comprises $Ga_{y2}In_{1-y2}N$, where $0.92 \leq y2 \leq 1$, and wherein said n-type cladding layer comprises gallium nitride (GaN) doped with a donor impurity.

3. The Group III nitride compound semiconductor according to claim 2, wherein said n-type cladding layer is formed on a lower n type layer comprising gallium nitride (GaN), said lower n-type layer being doped with a donor impurity and comprising a donor impurity density higher than a donor impurity density of said n-type cladding layer.

4. The Group III nitride compound semiconductor according to claim 1, wherein said donor impurity is silicon (Si).

5. The Group III nitride compound semiconductor according to claim 1, wherein said acceptor impurity is magnesium (Mg).

6. The Group III nitride compound semiconductor according to claim 1, wherein said emission layer is doped with silicon (Si).

7. The Group III nitride compound semiconductor comprising:

a multiple layer structure including an emission layer sandwiched between an n-type layer and a p-type layer;

said emission layer comprising a semiconductor material satisfying the formula $$Al_{x1}Ga_{y1}In_{1-x1-y1}N,$$

where $0 \leq x1 \leq 1$, $0 \leq y1 \leq 1$, and $0 \leq x1+y1 \leq 1$, said emission layer having a thickness of 0.1 μm to 1 μm which is significantly larger than a diffusion length of holes within said emission layer into which electrons are injected from said n-type cladding layer and holes are injected from said p-type cladding layer;

said n-type cladding layer satisfying the formula $$Al_{x2}Ga_{y2}In_{1-x2-y2}N,$$

$0 \leq x2 \leq 1$, $0 \leq y2 \leq 1$, and $0 \leq x2+y2 \leq 1$, being doped with a donor impurity; and said p-type cladding layer satisfying the formula $$Al_{x3}Ga_{y3}In_{1-x3-y3}N,$$

where $0 \leq x3 \leq 1$, $0 \leq y3 \leq 1$, and $0 \leq x3+y3 \leq 1$, being doped with an acceptor impurity.

8. The Group III nitride compound semiconductor according to claim 7, wherein said n-type layer has a lattice constant substantially equal to a lattice layer constant of said emission layer.

9. The Group III nitride compound semiconductor according to claim 8, wherein said p-type layer comprises a forbidden band sufficiently wider than a forbidden band of said emission layer to confine electrons injected into said emission layer.

10. The Group III nitride compound semiconductor according to claim 1, wherein a misfit ratio between said lattice constant of said n-type cladding layer and said lattice constant of said emission layer is within 1%.

11. The Group III nitride compound semiconductor according to claim 8, wherein a misfit ratio between said lattice constant of said n-type cladding layer and said lattice constant of said emission layer is within 1%.

12. The Group III nitride compound semiconductor according to claim 3, wherein said lower n-type layer is formed on a surface of a sapphire substrate.

13. The Group III nitride compound semiconductor according to claim 7, wherein said multiple layer structure is formed on a surface of a sapphire substrate.

14. The Group III nitride compound semiconductor according to claim 7, wherein said emission layer comprises $Ga_{y2}In_{1-y2}N$, where $0 < y2 < 1$.

15. The Group III nitride compound semiconductor according to claim 7, wherein said emission layer comprises $Ga_{0.93}In_{0.07}N$.

16. A Group III nitride compound semiconductor according to claim 1, said semiconductor further comprising:

a substrate; and a buffer layer formed on said substrate, said triple layer structure being formed on said buffer layer.

17. A Group III nitride compound semiconductor according to claim 7, said semiconductor further comprising:

a substrate; and a buffer layer formed on said substrate, said triple layer structure being formed on said buffer layer.

18. A Group III nitride compound semiconductor according to claim 1, wherein said emission layer comprises $In_{1-y}Ga_yN$, where $0.92 \leq y \leq 1$.

19. A Group III nitride compound device semiconductor comprising:

a substrate, characterized by a lattice constant $LC_s$;

an n-type cladding layer formed on the substrate;

an emission layer formed on the n-type cladding layer; and a p-type cladding layer formed on the emission layer;

wherein:

the emission layer satisfies the formula:

$$Al_{x1}Ga_{y1}In_{1-x1-y1}N,$$

where $0 \leq x1 \leq 1$, $0 \leq y1 \leq 1$, and $0 \leq x1+y1 \leq 1$, and is characterized by 1) a thickness $T_c$; 2) a lattice constant $LC_c$ ($LC_c \neq LC_s$); 3) a valence band value $V_c$, and a conduction band value $C_c$, the difference $C_c - V_c$ defining a forbidden band $FB_c$; and 4) a hole diffusion length $D_h$ and an electron diffusion length $D_e$ where $D_e \geq T_c > D_h$;

the n-type cladding layer satisfies the formula $$Al_{x2}Ga_{y2}In_{1-x2-y2}N$$

($0 \leq x2 \leq 1$, $0 \leq y2 \leq 1$, and $0 \leq x2+y2 \leq 1$) and is doped with a donor impurity and is characterized by 1) a lattice constant $LC_n$ ($LC_n \neq LC_c$); and 2) a valence band value $V_n$ and a conduction band value $C_n$, the difference $C_n - V_n$ defining a forbidden band $FB_n$ where $FB_n > FB_c$; and the p-type cladding layer satisfies the formula $$Al_{x3}Ga_{y3}In_{1-x3-y3}N$$

$0 \leq x3 \leq 1$, $0 \leq y3 \leq 1$, and $0 \leq x3+y3 \leq 1$) and is doped with an acceptor impurity and is characterized by 1) a lattice constant $LC_p$ ($LC_p \approx LC_c$); and 2) a valence band value $V_p$ and a conduction band value $C_p$, the difference $C_p - V_p$ defining a forbidden band $FB_p$, where $FB_p > FB_c$; and further wherein the relative amounts of the constituent materials in each of said n-type cladding layer, said p-type cladding layer, and said emission layer are selected such that when a biasing voltage is applied to the device sufficient to shift the valence band values so that $V_c \approx V_p \geq V_n$ and to shift the conduction band values so that $C_c \approx C_n < C_p$, 1) holes are injected from the p-type cladding layer into the emission layer and electrons are injected into the emission layer from the n-type cladding layer; 2) the difference $C_p - C_c$ defines an electron barrier $B_c$ that is sufficient to confine within the emission layer substantially all of the electrons injected from the n-type cladding layer; and 3) the difference $V_c - V_n$ defines a hole barrier $B_h$ that is insufficient to contain within the emission layer the majority of holes injected from the p-type cladding layer.

20. The Group III nitride compound semiconductor according to claim 1, wherein said emission layer comprises $Ga_{y2}In_{1-y2}N$, where $0.92 \leq y2 \leq 1$, and wherein said n-type cladding layer comprises gallium nitride (GaN) doped with a donor impurity, wherein said n-type cladding layer is formed on a lower n type layer comprising gallium nitride (GaN), said lower n-type layer being doped with a donor impurity and comprising a donor impurity density higher than a donor impurity density of said n-type cladding layer, wherein said donor impurity is silicon (Si), wherein said acceptor impurity is magnesium (Mg), and wherein said emission layer is doped with silicon (Si).

21. A Group III nitride compound semiconductor comprising:

a substrate;

an n-type high carrier concentration layer comprised of GaN formed on or above said substrate;

an n-type cladding layer comprised of $Al_{x2}Ga_{y2}In_{1-x2-y2}N$, where $0 \leq x2 \leq 1$, $0 \leq y2 \leq 1$, and $0 \leq x2+y2 \leq 1$, being doped with a donor impurity, and formed on or above said n-type high carrier concentration layer;

an emission layer comprised of $Al_{x1}Ga_{y1}In_{1-x1-y1}N$, where $0 \leq x1 \leq 1$, $0 \leq y1 \leq 1$, and $0 \leq x1+y1 \leq 1$, formed on or above said n-type cladding layer, and having a forbidden band narrower than a forbidden band of said n-type cladding layer;

a p-type cladding layer comprised of $Al_{x3}Ga_{y3}In_{1-x3-y3}N$, where $0 \leq x3 \leq 1$, $0 \leq y3 \leq 1$, and $0 \leq x3+y3 \leq 1$, being doped with an acceptor impurity, and having a forbidden band wider than said forbidden band of said n-type cladding layer; and a p-type contact layer comprised of GaN.

22. A Group III nitride compound semiconductor according to claim 21, wherein said emission layer is comprised of $In_{1-y}Ga_yN$, where $0 < y < 1$.

23. A Group III nitride compound semiconductor according to claim 1, further comprising:

an n-type high carrier concentration layer comprised of GaN and formed on or above said substrate; and a p-type contact layer comprised of GaN and formed on or above said p-type cladding layer.

24. A Group III nitride compound semiconductor according to claim 1, wherein said p-type cladding layer has a forbidden band wider than a forbidden band of said n-type cladding layer.

25. A Group III nitride compound semiconductor comprising:

a substrate;

cladding layer comprised of $Al_{x2}Ga_{y2}In_{1-x2-y2}N$, where $0 \leq x2 \leq 1$, $0 \leq y2 \leq 1$, and $0 \leq x2+y2 \leq 1$, being doped with a donor impurity and formed on or above said substrate;

an emission layer comprised of $Al_{x1}Ga_{y1}In_{1-x1-y1}N$, where $0 \leq x1 \leq 1$, $0 \leq y1 \leq 1$, and $0 \leq x1+y1 \leq 1$, formed on or above said n-type cladding layer, and having a forbidden band narrower than a forbidden band of said n-type cladding layer;

a p-type cladding layer comprised of $Al_{x3}Ga_{y3}In_{1-x3-y3}N$, where $0 \leq x3 \leq 1$, $0 \leq y3 \leq 1$, and $0 \leq x3+y3 \leq 1$, being doped with an acceptor impurity, and having a forbidden band wider than said forbidden band of said n-type cladding layer.

* * * * *

UNITED STATES PATENT AND TRADEMARK OFFICE
CERTIFICATE OF CORRECTION

PATENT NO. : 7,045,829 B2
APPLICATION NO. : 08/681412
DATED : May 16, 2006
INVENTOR(S) : Koike et al.

It is certified that error appears in the above-identified patent and that said Letters Patent is hereby corrected as shown below:

Col. 8, Claim 16, line 6, delete "a substrate; and".

Col. 8, Claim 19, line 32, replace "Vc' " with --Vc--.

Col. 8, Claim 19, line 51, replace " (LCp≈LCc) and " with --(LCp≠LCc) and --.

Col. 10, Claim 25, line 18, add --an n-type-- before the word "cladding".

Signed and Sealed this

Twenty-fourth Day of October, 2006

JON W. DUDAS
*Director of the United States Patent and Trademark Office*